United States Patent [19]

Chu et al.

[11] 4,406,050
[45] Sep. 27, 1983

[54] METHOD FOR FABRICATING LEAD HALIDE SENSITIZED INFRARED PHOTODIODES

[75] Inventors: Tak-Kin Chu, Bethesda; Alan C. Bouley, Silver Spring, both of Md.

[73] Assignee: The United States of America as represented by the Secretary of the Navy, Washington, D.C.

[21] Appl. No.: 358,940

[22] Filed: Mar. 17, 1982

[51] Int. Cl.³ ............... H01L 21/203; H01L 21/285; H01L 27/14
[52] U.S. Cl. .................... 29/572; 29/576 E; 148/1.5; 427/84; 357/30
[58] Field of Search .............. 357/30; 427/84, 89, 427/91; 29/572, 576 E, 590; 148/1.5

[56] References Cited

U.S. PATENT DOCUMENTS 4,263,604  4/1981  Jensen et al. .................. 357/30

Primary Examiner—M. J. Andrews
Assistant Examiner—Alan E. Schiavelli
Attorney, Agent, or Firm—R. F. Beers; K. E. Walden; R. D. Johnson

[57] ABSTRACT

A process for preparing an infrared sensitive photodiode comprising the steps of (1) forming by vacuum deposition an epitaxial layer of a semiconductor alloy material which is PbS, PbSe, PbTe, $PbS_xSe_{1-x}$, $PbS_xTe_{1-x}$, $PbSe_xTe_{1-x}$, $Pb_ySn_{1-y}S$, $Pb_ySn_{1-y}Se$, $Pb_ySn_{1-y}Te$, $Pb_ySn_{1-y}S_xSe_{1-x}$, $Pb_ySn_{1-y}S_xTe_{1-x}$, $Pb_ySn_{1-y}Se_xTe_{1-x}$, $Pb_zCd_{1-z}S$, $Pb_zCd_{1-z}Se$, $Pb_zCd_{1-z}Te$, $Pb_zCd_{1-z}S_xSe_{1-x}$, $Pb_zCd_{1-z}S_xTe_{1-x}$, or $Pb_zCd_{1-z}Se_xTe_{1-x}$, wherein $0<x<1$, $0<y<1$, and $0<z<1$, to cover at least a portion of the surface of a substrate composed of an infrared transparent single crystal material which is an alkali halide or an alkaline earth halide;

(2) forming a layer of a lead halide which is $PbCl_2$, $PbBr_2$, $PbF_2$, or mixtures thereof on the epitaxial layer of semiconductor material by exposing the epitaxial layer to vapor of the lead halide in air for at least 6 hours wherein the lead halide vapor is produced by heating the lead halide at a temperature of from about 175° C. to about 225° C.;

(3) vacuum depositing Pb metal onto a portion of the epitaxial layer of semiconductor alloy material to form a non-Ohmic Pb metal contact; and (4) forming an Ohmic contact on another portion of the epitaxial layer of semiconductor material.

6 Claims, 2 Drawing Figures

METHOD FOR FABRICATING LEAD HALIDE SENSITIZED INFRARED PHOTODIODES

BACKGROUND OF THE INVENTION

This invention relates to photodetectors and more particularly to infrared-sensitive photodiodes.

It is well established that single crystal films of lead chalcogenides, lead tin chalcogenides, and lead cadmium chalcogenides can be epitaxially grown on heated alkali halide and alkaline earth halide substrates by vacuum evaporation. The chalcogenides used include the sulfides, selenides, tellurides, and mixtures thereof. The substrates are single crystals of infrared transparent alkali halides and alkaline earth halides. Examples include barium fluoride, strontium fluoride, calcium fluoride, lithium fluoride, sodium chloride, potassium chloride, etc.

It is also well known that the vacuum deposition of a metal contact of certain materials such as lead or indium, on the surface of an epitaxial layer of a lead chalcogenide, lead tin chalcogenide, or lead cadmium chalcogenide creates a non-Ohmic Schottky barrier at the point of contact, resulting in an infrared sensitive photodiode. Vacuum depositing a contact of certain other metals (e.g., Au, Ni, Pb, or Pt) at another point on the epitaxial layer provides the Ohmic contact necessary for measuring the photovoltage of the device.

Attention is called to U.S. Pat. No. 4,263,604, entitled "Graded Gap Semiconductor Detector," issued on Apr. 21, 1981 to James D. Jensen and Richard B. Schoolar wherein an extensive bibliography of articles and patents dealing with these Schottky barrier devices is listed in the background of the invention.

Despite the usefulness of these prior art devices and processes, there are two areas where improvement would be desirable. First, it would be desirable to improve the reliability of fabrication of these devices and second, it would be desirable to increase the performance of these devices.

A. C. Bouley, H. R. Riedl, J. D. Jensen, S. R. Jost in U.S. patent application Ser. No. 358,941, filed Mar. 17, 1982, entitled "Sensitized Epitaxial Infrared Detector," disclose that the presence of halide ions in the interface region between a non-Ohmic lead metal and an epitaxial layer of II-IV-VI semiconductor alloy material (i.e., lead chalcogenide, lead tin chalcogenide, or lead cadmium chalcogenide) increases the performance of these infrared detecting diodes. The number of rejects in the manufacturing process was also reduced.

Nevertheless, it would be desirable to have a still more reliable method of making these diodes.

SUMMARY OF THE INVENTION

Accordingly, an object of this invention is to provide an improved method of producing infrared sensitive Schottky barrier devices.

Another object of this invention is to reduce the number of rejects resulting during the production of infrared sensitive Schottky barrier diodes.

A further object of this invention is to provide a process of making infrared sensitive Schottky barrier devices with greater control over the sensitivities of those devices.

These and other objects of this invention are achieved by providing:

In a process of producing infrared sensitive Schottky barrier diodes by
(1) vacuum depositing an epitaxial layer of a semiconductor alloy which is a lead chalcogenide, lead tin chalcogenide, or lead cadmium chalcogenide onto a substrate of a single crystal of an infrared transparent material which is an alkali halide or an alkaline earth halide;
(2) vacuum depositing Pb metal on to a portion of the epitaxial layer of semiconductor alloy to form a non-Ohmic contact; and
(3) forming an Ohmic contact on another portion of the epitaxial layer of semiconductor alloy;
the improvement comprising:
exposing the epitaxial layer of semiconductor alloy to the vapor of a lead halide selected from the group consisting of $PbCl_2$, $PbBr_2$, $PbF_2$, and mixtures thereof at a temperature of from about 175° C. to about 225° C. in the presence of air for at least 6 hours prior to the vacuum deposition of Pb to form the non-Ohmic contact.

BRIEF DESCRIPTION OF THE DRAWINGS

A more complete appreciation of this invention and many of the attendant advantages thereof will be readily appreciated as the same becomes better understood by reference to the following detailed description when considered in connection with the accompanying drawings.

DETAILED DESCRIPTION OF THE PREFERRED EMBODIMENT

Figure 1:
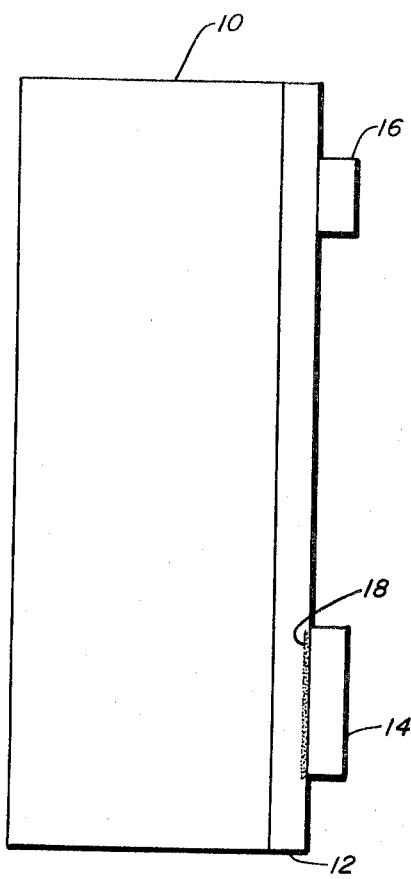
FIG. 1 is a schematic representation of a cross-sectional side view of an infrared Schottky barrier diode produced by the process of this invention.

It has now been discovered that the presence of halide ions in the zone or region between an epitaxial layer of a II-IV-VI semiconductor alloy and a non-Ohmic Pb contact (i.e., Schottky barrier forming means) of certain prior art infrared sensitive photodiodes substantially enhances the performance of those photodiodes. FIG. 1 schematically represents a cross-sectional side view of the device. A single crystal thin film of semiconductor material 12 is epitaxially grown by vacuum deposition onto an infrared transparent single crystal substrate 10. An Ohmic contact 16 and a non-Ohmic contact 14 are each vacuum deposited onto the semiconductor thin film 12 by conventional means. The halide ions present on and extending a short distance into the epitaxial semiconductor film 12 at the region of contact 18 are the novel features of the present invention.

Suitable substrate 10 materials must be infrared transparent. Single crystals of alkali halides (e.g., KCl, NaCl, KBr) and alkaline earth halides (e.g., $BaF_2$, $SrF_2$, $Ba_wSr_{1-w}F_2$ with $0<w<1$), have previously been found to be suitable. However, certain of the compounds (e.g., NaCl, KCl) are less preferred or even unsuitable because they are hygroscopic. In conclusion those substrate 10 materials which are suitable for use in the cited prior art infrared sensitive photodiodes are also suitable for the photodiodes of the present invention.

The epitaxial layer of semiconductor material 12 is produced by the vacuum deposition of a lead chalcogenide, lead tin chalcogenide, or lead cadmium chalcogenide onto the heated substrate 10. The chalcogenides used include sulfides, selenides, tellurides, and mixtures thereof. More specifically, some of the materials which may be used are represented by the following formulas: PbS, PbSe, PbTe, $PbS_xSe_{1-x}$, $PbS_xTe_{1-x}$, $PbSe_xTe_{1-x}$, $Pb_ySn_{1-y}S$, $Pb_ySn_{1-y}Se$, $Pb_ySn_{1-y}Te$, $Pb_ySn_{1-y}S_xSe_{1-x}$, $Pb_ySn_{1-y}S_xTe_{1-x}$, $Pb_ySn_{1-y}Se_xTe_{1-x}$, $Pb_zCd_{1-z}S$, $Pb_zCd_{1-z}Se$, $Pb_zCd_{1-z}Te$, $Pb_zCd_{1-z}S_xSe_{1-x}$, $Pb_zCd_{1-z}S_xTe_{1-x}$, and $Pb_zCd_{1-z}Se_xTe_{1-x}$, wherein $0<x<1$, $0<y<1$ and $0<z<1$, and preferably $0.9<y<1$ and $0.8<z<1$. Preferred among these materials are the lead chalcogenides: PbS, PbSe, PbTe, $PbS_xSe_{1-x}$, and $PbSe_xTe_{1-x}$ wherein $0<x<1$.

The epitaxial layer of semiconductor material 12 is grown on the substrate by conventional vacuum deposition techniques. Examples of these techniques are disclosed in U.S. Pat. No. 3,716,424, entitled "Method of Preparation of Lead Sulfide PN Junction Diodes", which was issued to Richard B. Schoolar on Feb. 13, 1973 and U.S. Pat. No. 4,154,631, entitled "Equilibrium Growth Techniques for Preparing $PbS_xSe_{1-x}$ Epilayers," which was issued to Richard B. Schoolar on May 15, 1979, herein incorporated by reference.

After the epitaxial layer of semiconductor material has been deposited, and prior to lead (Pb) metal deposition, the semiconductor is annealed at about 170° C. for about 30 minutes in vacuum to desorb oxygen on its surface. The semiconductor is then cooled to room temperature.

Conventionally, a Schottky barrier is next formed by vacuum depositing a dot or strip of lead (Pb) metal onto a portion of the epitaxial layer of semiconductor alloy to form a non-Ohmic contact 14. This step is performed with the lead (Pb) evaporation source at a temperature of about 1200° C. or more and under a vacuum of at least $10^{-5}$ torr and preferable $10^{-6}$ torr. This process takes about 10 minutes.

The present invention involves the vapor deposition of a lead halide which is $PbCl_2$, $PbBr_2$, $PbF_2$, or mixture thereof onto the outer surface of the epitaxial layer of semiconductor alloy 12 prior to the vacuum deposition of Pb metal to form the non-Ohmic contact 14. $PbCl_2$ is preferred because of its relatively low toxicity. The epitaxial layer of II-IV-VI semiconductor alloy material 12 is exposed to the lead halide vapor in the presence of air at normal atmospheric pressure at a temperature of preferably from about 175° C. to about 225° C., but more preferably from 190° C. to 210° C., for a period of at least 6 hours and preferably for at least 8 hours. Exposure times of up to 80 hours or more also produce satisfactory results. Thus, the upper range of the time of exposure is limited only by practical, economical considerations.

Figure 2:
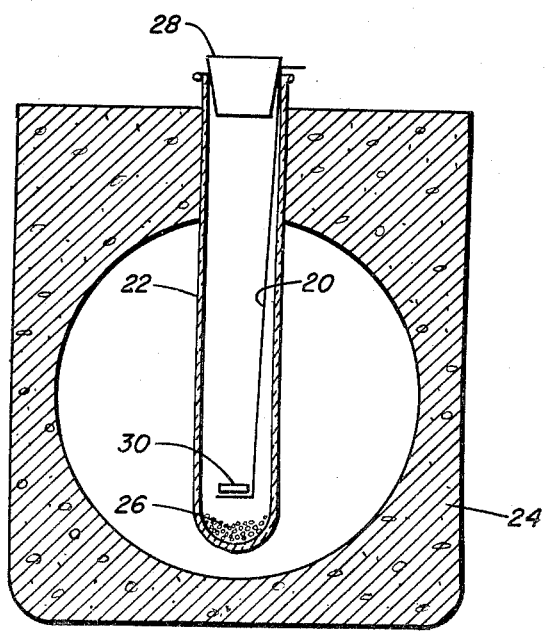
FIG. 2 shows typical laboratory apparatus which are used in present processes for introducing halide ions onto the semiconductor surface.

FIG. 2 is a cross-sectional schematic representation of typical laboratory apparatus, used for this vapor deposition step. A test tube 22 was placed in an oven 24. The lead halide (e.g., $PbCl_2$) 26 was placed in the bottom of the test tube 22. An epitaxial layer of a semiconductor alloy (e.g. $PbS_{0.5}Se_{0.5}$) on a substrate 30 was supported on a Kenthal wire support 20 about 2 cm above the lead halide 26 in the test tube 22. A stopper 28 closed off the test tube 22.

An excess of the lead halide may be present without significantly changing the results. Note that air is present in the test tube. The presence of oxygen improves the results.

Referring again to FIG. 1, next the non-Ohmic lead (Pb) metal contact 14 is vacuum deposited on to the lead halide coated epitaxial layer of semiconductor alloy 12 according to the prior art methods described above. An Ohmic contact 16 is then formed on the epitaxial layer of semiconductor alloy 12 according to prior art techniques.

Note that while the lead halide will be distributed over the entire epitaxial layer of semiconductor alloy 12, only that portion lying in the zone 18 between the non-Ohmic Pb contact 14 and the epitaxial layer of semiconductor alloy 12 will improve the operation of the device.

The general nature of the invention having been set forth, the following examples are presented as specific illustrations thereof. It will be understood that the invention is not limited to these specific examples, but is susceptible to various modifications that will be recognized by one of ordinary skill in the art.

The performance of an infrared detector is characterized by its detectivity, $D^*$, in $cmHz^{\frac{1}{2}}/w$. The following values of $D^*$ were measured on detectors of both PbS and $PbS_{0.5}Se_{0.5}$ semiconductor alloy. Included in this table are $D^*$ values for both prior art unsensitized detectors as well as for detectors sensitized with $PbCl_2$ in the process described in this invention. These values are representative of the improvement in performance provided by this invention.

| Detector Semiconductor Alloy | Sensitized with $PbCl_2$ | $D^*$ @ 300° K. | $D^*$ @ 77° K. |
| --- | --- | --- | --- |
| PbS | yes | $1.8 \times 10^9$ | $1.6 \times 10^{11}$ |
| PbS | no | — | $4.0 \times 10^{10}$ |
| $PbS_{.5}Se_{.5}$ | yes | $5.9 \times 10^9$ | $2.1 \times 10^{11}$ |
| $PbS_{.5}Se_{.5}$ | no | $6.2 \times 10^8$ | $1.2 \times 10^{10}$ |

Obviously, numerous modifications and variations of the present invention are possible in light of the above teachings. It is therefore to be understood that within the scope of the appended claims the invention may be practiced otherwise than as specifically described herein.

What is claimed and desired to be secured by Letters Patent of the United States is:

1. In a process for preparing an infrared sensitive photodiode comprising the steps of
   (1) forming by vacuum deposition an epitaxial layer of a semiconductor alloy material selected from the group consisting of PbS, PbSe, PbTe, $PbS_xSe_{1-x}$, $PbS_xTe_{1-x}$, $PbSe_xTe_{1-x}$, $Pb_ySn_{1-y}S$, $Pb_ySn_{1-y}Se$, $Pb_ySn_{1-y}Te$, $Pb_ySn_{1-y}S_xSe_{1-x}$, $Pb_ySn_{1-y}S_xTe_{1-x}$, $Pb_ySn_{1-y}Se_xTe_{1-x}$, $Pb_zCd_{1-z}S$, $Pb_zCd_{1-z}Se$, $Pb_zCd_{1-z}Te$, $Pb_zCd_{1-z}S_xSe_{1-x}$, $Pb_zCd_{1-z}S_xTe_{1-x}$, and $Pb_zCd_{1-z}Se_xTe_{1-x}$, wherein $0<x<1$, $0<y<1$, and $0<z<1$, to cover at least a portion of the surface of a substrate composed of an infrared transparent single crystal material selected from the group consisting of
   (a) alkali halides and
   (b) alkaline earth halides;
   (2) vacuum depositing Pb metal onto a portion of the epitaxial layer of semiconductor alloy material to form a non-Ohmic Pb metal contact; and
   (3) forming an Ohmic contact on another portion of the epitaxial layer of semiconductor material;
   the improvement comprising:
   after step (1) but prior to step (2), forming a layer of a lead halide selected from the group consisting of $PbCl_2$, $PbBr_2$, $PbF_2$, and mixtures thereof on the epitaxial layer of semiconductor material by exposing the epitaxial layer to vapor of the lead halide in air for at least 6 hours wherein the lead halide vapor is produced by heating the lead halide at a temperature of from about 175° C. to about 225° C.

2. The process of claim 1 wherein the epitaxial semiconductor alloy material is selected from the group consisting of PbS, PbSe, PbTe, $PbS_xSe_{1-x}$, and $PbSe_xTe_{1-x}$ wherein $0<x<1$.

3. The process of claim 1 wherein $0.9<y<1$ and $0.80<z<1.0$.

4. The process of claim 1, 2, or 3 wherein the lead halide is $PbCl_2$.

5. The process of claim 1, 2, and 3 wherein the lead halide is heated at a temperature of from 190° C. to 210° C.

6. The process of claim 4 wherein the lead halide is heated at a temperature of from 190° to 210° C.

* * * * *